(12) United States Patent
Kim et al.

(10) Patent No.: US 12,001,598 B2
(45) Date of Patent: *Jun. 4, 2024

(54) INFORMATION OUTPUT DEVICE

(71) Applicant: DOT INCORPORATION, Seoul (KR)

(72) Inventors: Ju Yoon Kim, Gimpo-si (KR); Ji Ho Kim, Gimpo-si (KR); Hyeon Cheol Park, Gwangmyeong-si (KR)

(73) Assignee: Dot Incorporation, Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/192,140

(22) Filed: Mar. 29, 2023

(65) Prior Publication Data

US 2023/0251704 A1 Aug. 10, 2023

Related U.S. Application Data

(63) Continuation of application No. 17/099,174, filed on Nov. 16, 2020, now Pat. No. 11,635,801, which is a
(Continued)

(30) Foreign Application Priority Data

May 16, 2018 (KR) .......................... 10-2018-0056173

(51) Int. Cl.
*G06F 3/01* (2006.01)
*G08B 6/00* (2006.01)
*H05K 5/06* (2006.01)

(52) U.S. Cl.
CPC ............. *G06F 3/01* (2013.01); *G08B 6/00* (2013.01); *H05K 5/06* (2013.01)

(58) Field of Classification Search
CPC ............... G06F 3/01; G08B 6/00; H05K 5/06
See application file for complete search history.

(56) References Cited

U.S. PATENT DOCUMENTS 5,449,292 A * 9/1995 Tani .................... G09B 21/004
434/114
6,217,338 B1 * 4/2001 Tieman ................ G09B 23/306
434/114
(Continued)

FOREIGN PATENT DOCUMENTS

KR 10-0568695 B1 4/2006
KR 10-2007-0093045 A 9/2007
(Continued)

OTHER PUBLICATIONS

International Search Report and Written Opinion dated Aug. 23, 2019 in International Application No. PCT/KR2019/005863, in 9 pages. (English translation of ISR.).

*Primary Examiner* — Amare Mengistu
*Assistant Examiner* — Jennifer L Zubajlo
(74) *Attorney, Agent, or Firm* — Knobbe, Martens, Olson & Bear, LLP

(57) ABSTRACT

This application relates to an information output apparatus. In one aspect, the apparatus includes a casing including an expression surface and an expression hole formed in the expression surface. The apparatus also includes a protrusion provided to reciprocate such that at least a part thereof protrudes out of the expression hole and information is expressed on the expression surface. The apparatus also includes a driving module located inside the casing and connected to the protrusion to move the protrusion.

11 Claims, 8 Drawing Sheets

Related U.S. Application Data continuation of application No. PCT/KR2019/005863, filed on May 16, 2019.

(56) References Cited

U.S. PATENT DOCUMENTS

| | | | | |
|---|---|---|---|---|
| 7,497,687 | B2* | 3/2009 | Shin | G09B 21/004 434/114 |
| 7,737,828 | B2* | 6/2010 | Yang | G06F 3/016 340/407.1 |
| 8,740,618 | B2* | 6/2014 | Shaw | G09B 21/003 340/407.1 |
| 9,734,731 | B2* | 8/2017 | Van Hees | G09B 21/00 |
| 10,152,169 | B2* | 12/2018 | Smith | A45F 5/00 |
| 10,217,389 | B2* | 2/2019 | Kim | G08B 6/00 |
| 2006/0101685 | A1* | 5/2006 | Smith, III | G09F 21/049 40/556 |
| 2012/0118773 | A1* | 5/2012 | Rayner | A45C 13/002 206/320 |
| 2017/0309203 | A1* | 10/2017 | Kim | G09B 21/006 |
| 2017/0352291 | A1* | 12/2017 | Kim | G09B 21/004 |
| 2019/0073923 | A1* | 3/2019 | Kim | G09B 21/004 |
| 2021/0082314 | A1* | 3/2021 | Lee | H01F 27/30 |
| 2021/0090411 | A1* | 3/2021 | Kim | G06F 3/01 |

FOREIGN PATENT DOCUMENTS

| | | |
|---|---|---|
| KR | 10-2010-0090520 A | 8/2010 |
| KR | 10-2011-0008469 A | 1/2011 |
| KR | 10-2013-0001008 A | 1/2013 |
| KR | 10-1597911 B1 | 3/2016 |

* cited by examiner

INFORMATION OUTPUT DEVICE

CROSS REFERENCE TO RELATED APPLICATIONS

The present application is a continuation of U.S. patent application Ser. No. 17/099,174, filed Nov. 16, 2020, which is a continuation application based on International Patent Application No. PCT/KR2019/005863, filed on May 16, 2019, which claims priority to Korean patent application No. 10-2018-0056173 filed on May 16, 2018, contents of each of which are incorporated herein by reference in their entireties.

BACKGROUND

Technical Field

One or more embodiments of the disclosure relate to an information output apparatus.

Description of Related Technology

Users may recognize information in various ways. To this end, various types of information output apparatuses are being used.

For example, a visual information output apparatus using a printed material, an audio information output apparatus via sound, etc. are used.

In particular, according to an increase in an amount of information and development of technology, information output apparatuses using electronic technologies are widely used nowadays, and a display apparatus having a plurality of pixels is frequently used as a visual information output apparatus.

SUMMARY

One or more embodiments of the disclosure provide an information output apparatus having an improved durability and being capable of improving user's convenience and providing waterproof and/or dampproof function.

According to an embodiment of the disclosure, an information output apparatus includes a casing including an expression surface and an expression hole formed in the expression surface, a protrusion provided to reciprocate such that at least a part thereof protrudes out of the expression hole and information is expressed on the expression surface, a driving module located inside the casing and connected to the protrusion to move the protrusion, and a skin module located facing the expression surface, and including a film having a first surface and a second surface opposite to the first surface, the first surface facing the expression surface.

The casing may include an active region, in which the expression hole is located, and a non-active region at an edge of the active region, and the skin module may include a spacer having an opening corresponding to the active region, the spacer being provided between the film and the expression surface.

The information output apparatus may further include an adhesive film between the spacer and the casing.

The film and the spacer may be integrally provided.

The casing may include an active region in which the expression hole is located, a non-active region at an edge of the active region, and a groove corresponding to the active region.

The information output apparatus may further include an adhesive film between the film and the casing.

A first coupling unit may be located on at least a part of the casing, and the skin module may include a support unit coupled at least to an edge of the film, and a second coupling unit located on the support unit and configured to be coupled to the first coupling unit.

The information output apparatus may further include a sealing unit located at least one of between the support unit and the casing and between the film and the casing.

Other aspects, features and advantages of the disclosure will become better understood through the accompanying drawings, the claims and the detailed description.

An information output apparatus according to one or more embodiments of the disclosure includes a skin module for protecting an expression surface, periphery of an expression hole, and/or a driving module against external moisture, damp, and/or contaminants, and accordingly, a durability of the information output apparatus may be improved.

Moreover, a waterproof function required for daily life and an underwater waterproof function are provided, and thus the information output apparatus may be used as a wearable device or may be used underwater.

DETAILED DESCRIPTION

Figure 1:
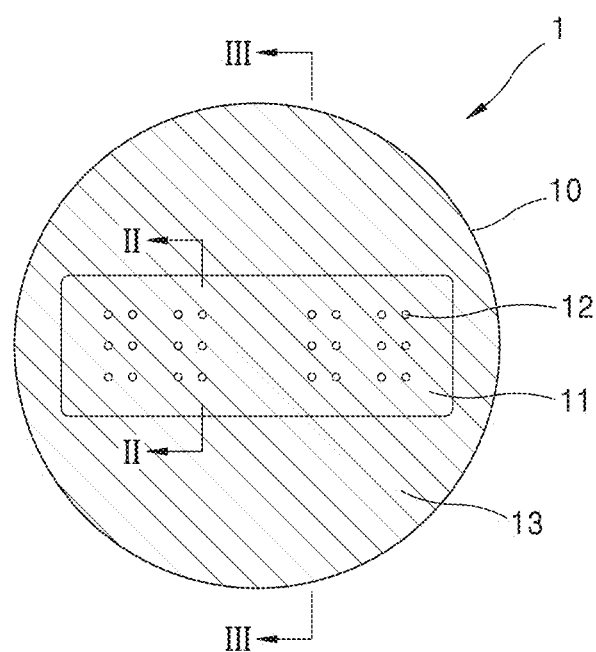
FIG. 1 is a plan view of an information output apparatus according to an embodiment.

Various forms of information output rather than the visual information output are required due to the development of technology, diversification of lifestyle, etc. This is because there is a limitation for a user in recognizing the visual information output.

For example, various information output apparatuses may be required according to a situation of each user, and in particular, when a user has a certain weakened sense, for example, when the user is visually impaired, it is necessary to output information through tactile sense.

Also, the information output apparatus through the tactile sense necessarily requires protruding movement of protrusions for implementing the tactile sense, and thus, there is a limitation in realizing a waterproof function and a durability of the information output apparatus degrades because the information output apparatus is vulnerable to contamination.

As the present disclosure allows for various changes and numerous embodiments, particular embodiments will be illustrated in the drawings and described in detail in the written description. The advantages and features of the embodiments and methods of achieving them will be apparent from the following embodiments that will be described in more detail with reference to the accompanying drawings. However, the embodiments may have different forms and should not be construed as being limited to the descriptions set forth herein.

The embodiments will be described below in more detail with reference to the accompanying drawings. Those components that are the same or are in correspondence are rendered the same reference numeral regardless of the figure number, and redundant explanations are omitted.

While such terms as "first," "second," etc., may be used to describe various components, such components must not be limited to the above terms. The above terms are used only to distinguish one component from another.

In all embodiments of the specification herein, a unit may denote a single component that executes a certain program, but is not limited thereto, and may be a partitioned area of at least one storage medium storing the program.

An expression used in the singular encompasses the expression of the plural, unless it has a clearly different meaning in the context.

In the present specification, it is to be understood that the terms such as "including," "having," and "comprising" are intended to indicate the existence of the features or components disclosed in the specification, and are not intended to preclude the possibility that one or more other features or components may exist or may be added.

Sizes of components in the drawings may be exaggerated for convenience of explanation. In other words, since sizes and thicknesses of components in the drawings are arbitrarily illustrated for convenience of explanation, the following embodiments are not limited thereto.

Figure 2:
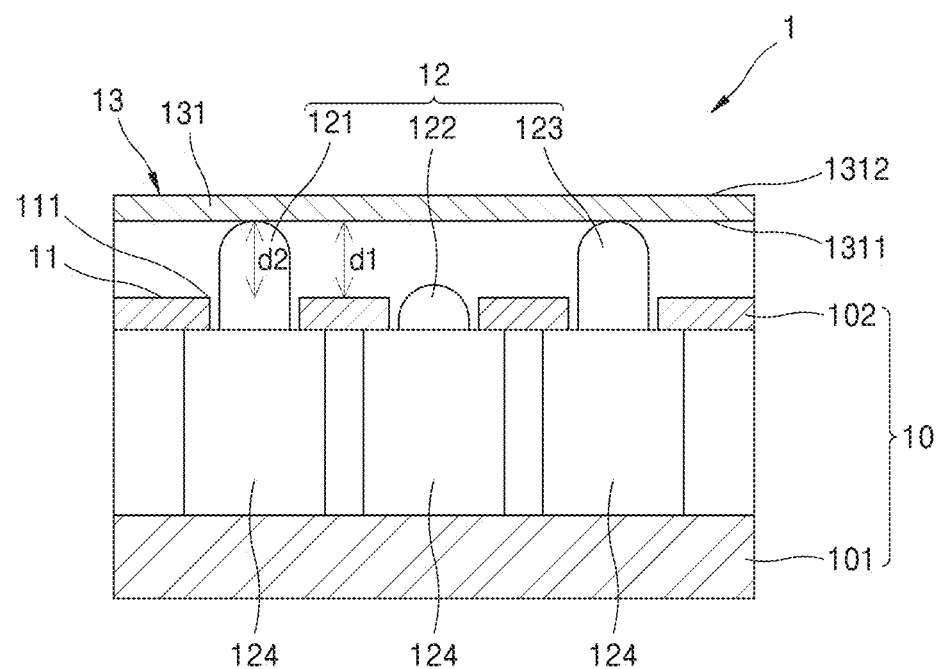
FIG. 2 is a cross-sectional view taken along line II-II of FIG. 1.
Figure 3:
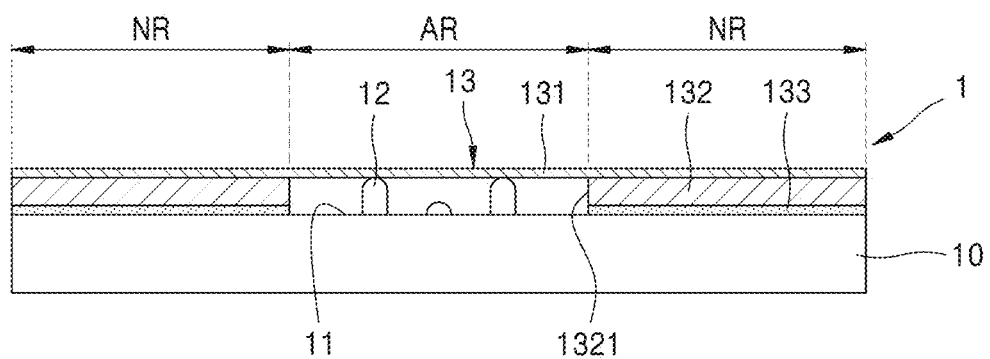
FIG. 3 is a cross-sectional view taken along line III-III of FIG. 1.

FIG. 1 is a plan view of an information output apparatus 1 according to an embodiment, and FIG. 2 is a cross-sectional view taken along line II-II of FIG. 1. FIG. 3 is a cross-sectional view taken along line III-III of FIG. 1.

The information output apparatus 1 according to the embodiment is provided to be portable, for example, may be provided in the form of a wrist watch worn on the wrist of a user or in the form of a portable terminal carried by the user. In addition, the information output apparatus 1 may be provided in the form of a wearable terminal that is in contact with a part of a user's body such that the user may feel through tactile sense. However, one or more embodiments are not limited thereto, and the information output apparatus may be an element attached to a building, equipment, and/or an apparatus.

Although not shown in the drawings, the information output apparatus 1 may communicate with a nearby computing device. The computing device may include a smart phone and/or a portable computer such as a tablet PC. The information output apparatus 1 may wirelessly communicate with the computing device via a near field and/or direct communication unit such as WiFi, Bluetooth, and/or NFC, but is not limited thereto, that is, the information output apparatus 1 may communicate with the computing device via wires.

The information output apparatus 1 may be provided to communicate with a server computer of various companies and/or institutions such as telecommunication companies, broadcasting companies, government agencies, etc., and these companies and/or institutions may receive information of various types through a wireless network, a wired network, and other various communication networks.

Referring to FIG. 1 and FIG. 2, the information output apparatus 1 may include a casing 10, protrusions 12, driving modules 124, and a skin module 13.

The casing 10 has a sealed internal space, in which the driving modules 124 may be accommodated.

The internal space of the casing 10 may be defined by a first casing 101 and a second casing 102 coupled to each other so as to face each other.

In FIG. 2, the driving module 124 is arranged to be in contact with an upper surface of the first casing 101 for convenience of description, but one or more embodiments of the disclosure are not limited thereto, that is, various elements such as a circuit board, a battery, and/or a controller for operating the driving module 124 may be further located between the driving module 124 and the first casing 101. Also, the first casing 101 may have a receptor structure for accommodating the elements.

In addition, the second casing is located facing the first casing 101, and the second casing 102 may include an expression surface 11 on at least a region of at least one outer surface thereof. The expression surface 11 may be a flat surface as shown in FIG. 2, but is not limited thereto, that is, the expression surface 11 may have various shapes, e.g., a curved surface, and/or a bent surface.

The second casing 102 may include expression holes 111 formed in the region that becomes the expression surface 11. Each of the expression holes 111 is provided such that the protrusion 12 may protrude from and may be pulled in the internal space of the casing 10, and at least a partial internal space of the casing 10 and the outside of the casing 10 may communicate with each other via the expression hole 111. The number of the expression holes 111 may correspond to the number of the protrusions 12.

There may be a plurality of driving modules 124, the number of which may correspond to the number of protrusions 12. The protrusions 12 and the driving modules 124 are coupled to each other in one-to-one correspondence, and each of the driving modules 124 may be electrically connected to a controller to be selectively driven. The driving module 124 may include an actuator that may be electrically driven.

The protrusions 12 may be located between the driving modules 124 and the second casing 102. The protrusions 12 are connected to the driving modules 124, and are operated according to the driving modules 124. The driving modules 124 and the protrusions 12 may be coupled to each other, but are not limited thereto, that is, the driving modules 124 and the protrusions 12 may be separated from each other and the protrusions 12 may be moved by receiving a driving force from the driving modules 124.

Each of the protrusions 12 may be located at a location corresponding to the expression hole 111, and at least a part of the protrusion 12 protrudes out of the expression hole 111 to provide a tactile expression to the user. The protrusion 12 may reciprocate to move in and move out of the expression hole 111, and although not shown in the drawings, a guide may be located adjacent to the expression hole 111 to guide the movement of the protrusion 12.

According to an embodiment, a plurality of protrusions 12 may be provided to represent special characters such as braille and to display a three-dimensional picture. The protrusion 12 may represent information by adjusting a protruding height out of the expression surface 11. For example, as shown in FIG. 2, a first protrusion 121, a second protrusion 122, and a third protrusion 123 adjacent to one another are provided. When the first protrusion 121 and the third protrusion 123 protrude to a maximum height and the second protrusion 122 protrude to a minimum height, the user may recognize that the first protrusion 121 and the third protrusion 123 protrude and may accordingly receive information.

The skin module 13 is located on an outer side of the casing 10, and as shown in FIG. 1, the skin module 13 may have an area that may at least cover the expression surface 11. Therefore, when the user may sense the skin module 13 first when sensing the expression surface 11 through the tactile sense, and may sense the movement of the protrusions 12, which is transferred through the tactile sense.

The skin module 13 may include a film 131.

The film 131 may be located facing at least the expression surface 11, and may extend along the expression surface 11.

The film 131 may include a first surface 1311 and a second surface 1312 facing each other, and the first surface 1311 may be arranged facing the expression surface 11. Therefore, the user may sense the second surface 1312 of the film 131 via the tactile sense.

The film 131 may include a material having flexibility and/or elasticity, and some degree of dampproof property, that is, the film 131 may include a polymer material, for example, polyurethane. Therefore, infiltration of moisture into the expression surface 11 via the film 131 may be prevented.

In addition, the film 131 may be formed not to have a large thickness, and the thickness of the film 131 may allow the user to feel the protruding state of the protrusion 12 under the film 131 when the user touches the second surface 1312 of the film 131.

The film 131 may be separated from the expression surface 11, and according to an embodiment, the film 131 may always maintain a separated state from the expression surface 11.

According to an embodiment, a separation distance d1 between the film 131 and the expression surface 11 may be equal to or greater than a maximum protruding height d2 of the protrusion 12 from the expression surface 11.

When the separation distance d1 between the film 131 and the expression surface 11 is less than the maximum protruding height d2 of the protrusion 12 from the expression surface 11, the first surface 1311 of the film 131 may be continuously hit due to the maximum protrusion of the protrusion 12, and thus, the film 131 may be damaged, and the protruding of the protrusion 12 may be interrupted and an overload may be applied to the driving module.

The separation distance d1 between the film 131 and the expression surface 11 may not be much greater than the maximum protrusion height d2 of the protrusion 12 from the expression surface 11, that is, a distance from the first surface 1311 of the film 131 to the end of the protrusion 12 in the maximum protruding state may correspond to a distance that the film 131 is pushed by the user touching the second surface 1312 such that the first surface 1311 may reach the protrusion 12. Accordingly, even when the first surface 1311 of the film 131 is separated from the end of the protrusion 12 that is in the maximum protruding state, the user may receive the information represented by the protrusion 12 via the second surface 1312.

The film 131 may include a material transmitting light, and accordingly, the user may observe information realized on the expression surface 11 from the outside of the film 131.

Referring to FIG. 3, according to the embodiment, the casing 10 may include an active region AR where the expression hole is located and a non-active region NR at an edge of the active region AR. The active region AR corresponds to a region in which the protruding of the protrusions 12 are activated and the expression is activated. In the embodiment or another embodiment, the active region AR may be a region in the expression surface 11, and the active region AR and the non-active region NR are partitioned in the expression surface 11.

The skin module 13 may further include a spacer 132 between the film 131 and the expression surface 11.

The spacer 132 may include an opening 1321 corresponding to the active region AR. Therefore, the protrusions 12 protrude from inside the opening 1321.

The spacer 132 may be bonded to the first surface 1311 of the film 131, and the separation of the film 131 from the expression surface 11 may be maintained by the spacer 132.

The spacer 132 may include a material that is harder than that of the film 131, but is not limited thereto, that is, may include a same kind of material.

An adhesive film 133 may be further provided between the spacer 132 and the casing 10. The spacer 132 may be fixedly attached to an outer surface of the casing 10 due to the adhesive film 133, and may form the internal region of the opening 1321, that is, the active region AR, as a sealed region that is shielded against the outside.

According to an embodiment, a sum of the thickness of the spacer 132 and the adhesive film 133 may be equal to the separation distance d1 between the film 131 and the expression surface 11 described above.

Figure 4:
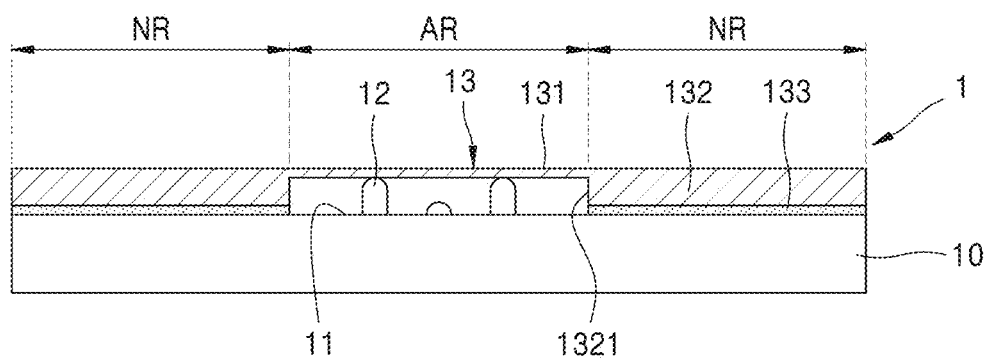
FIG. 4 is a cross-sectional view showing another example taken along line III-III of FIG. 1.

FIG. 4 is a cross-sectional view showing another example of the information output apparatus taken along line III-III of FIG. 1.

According to the embodiment illustrated with reference to FIG. 4, the spacer 132 and the film 131 may be integrally formed. That is, in a film including a single material, a thin groove is processed in a region corresponding to the active region AR, and then, the groove region becomes the film 131 and unprocessed region may maintain the thickness.

A film assembly in which the spacer 132 and the film 131 are integrally provided may be bonded to the casing 10 via the adhesive film 133.

Figure 5:
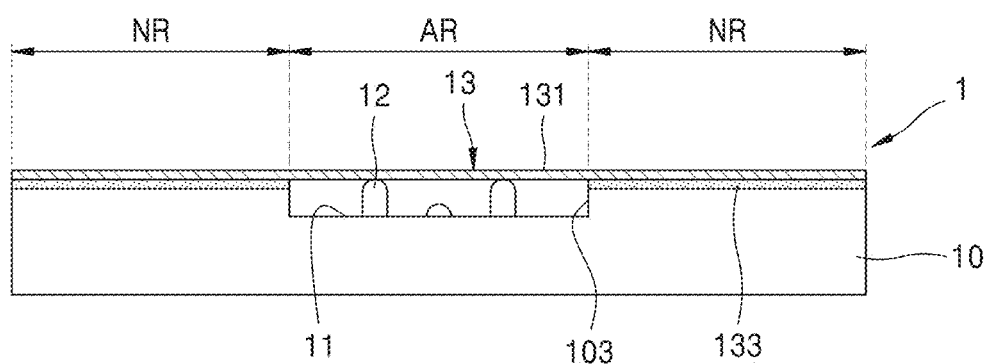
FIG. 5 is a cross-sectional view showing another example taken along line III-III of FIG. 1.

FIG. 5 is a cross-sectional view showing another example of the information output apparatus taken along line III-III of FIG. 1.

According to the embodiment illustrated with reference to FIG. 5, the casing 10 may include a groove 103 corresponding to the active region AR. Here, the expression surface 11 may be located inside the groove 103.

In this embodiment, the skin module 13 may only include the film 131 except for the spacer, and the film 131 may be attached to a surface of the casing 10 outside the groove 103 via the adhesive film 133.

According to an embodiment, a sum of a depth of the groove 103 and the thickness of the adhesive film 133 may be equal to the separation distance d1 between the film 131 and the expression surface 11 described above.

Although not shown in the drawings, the embodiments illustrated with reference to FIG. 3 to FIG. 5 may be combined to generate a new embodiment. For example, the skin module 13 including the spacer 132 shown in FIG. 2 and/or FIG. 3 may be coupled to the casing 10 having the groove 103 as in the embodiment of FIG. 5.

Figure 6:
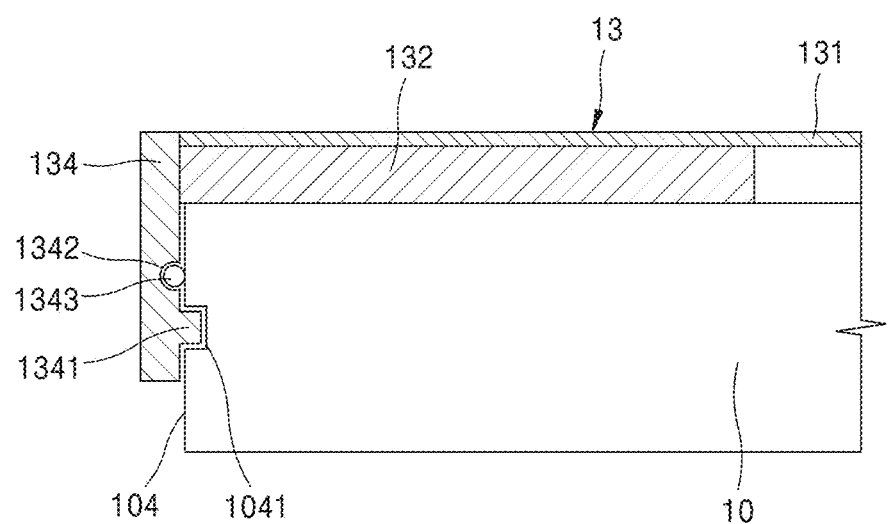
FIG. 6 is a partially cross-sectional view showing a portion of an information output apparatus according to another embodiment.

FIG. 6 is a cross-sectional view partially showing an information output apparatus according to another embodiment.

Referring to FIG. 6, the information output apparatus according to another embodiment of the disclosure may include a first coupling unit 1041 located in at least a part of the casing 10 and a second coupling unit 1341 located on the skin module 13.

The skin module 13 may include further include a support unit 134 coupled to at least an edge of the film 131. According to an embodiment, the support unit 134 may be fixedly coupled to the edges of the film 13 and the spacer 132. In an embodiment in which a spacer is not necessary, the support unit 134 would be fixedly coupled to the edge of the film 131.

The support unit 134 may extend from the edge of the film 13 towards a side surface 104 of the casing 10, and may be located facing the side surface 104.

The support unit 134 may include plastic and/or metal, and may have a certain degree of elasticity in a direction perpendicular to a lengthwise direction thereof.

The second coupling unit 1341 may be located on the support unit 134, and according to an embodiment, the second coupling unit 1341 may be on a surface of the support unit 134, the surface facing the side surface 104.

The second coupling unit 1341 is provided to be coupled to the first coupling unit 1041 formed in the side surface 104. Therefore, when the first coupling unit 1041 is formed as a groove as shown in FIG. 6, the second coupling unit 1341 may be formed as a protrusion that may be inserted into the groove. The groove and the protrusion are not limited to rectangular shapes as shown in the drawings, but may have various shapes such as a semicircular shape, a semi-elliptical shape, a fan shape, a triangular shape, a pentagonal shape, etc. Also, the first coupling unit 1041 may be formed as a protrusion and the second coupling unit 1341 may be formed as a groove.

According to the above structure, the skin module 13 may be detachably coupled to the casing 10 without using a separate adhesive film, and thus, the user may easily replace the skin module 13. Therefore, when the film 131 is worn, the skin module 13 may be replaced to maintain the sealing property of the active region AR. Moreover, the skin module 13 may be provided to have the film 131 of various colors, and thus, the user may selectively attach the skin module 13 having the film 131 of a desired color to the casing 10.

According to another embodiment, the information output apparatus may further include a first sealing unit 1343 between the support unit 134 and the side surface 104 of the casing 10 as shown in FIG. 6. For mounting the first sealing unit 1343, the support unit 134 may include a first mounting recess 1342 on a region facing the side surface 104, and when the first sealing unit 1343 is mounted in the first mounting recess 1342, the first sealing unit 1343 may be fixedly located between the casing 10 and the support unit 134.

A location where the first sealing unit 1343 is mounted may be closer to the film 131 than the first coupling unit 1041 and the second coupling unit 1341 described above.

Infiltration of the moisture and damp into the active region AR from the outside may be blocked by the first sealing unit 1343, and moreover, introduction of other contaminants such as dust into the active region AR may be prevented.

The first sealing unit 1343 may include a material that may be elastically compressible, and as shown in FIG. 6, the first sealing unit 1343 may be partially and forcibly fitted into the first mounting recess 1342 of the support unit 134. However, one or more embodiments are not limited thereto, that is, the first sealing unit 1343 may be bonded to the first mounting recess 1342. Selectively, the first sealing unit 1343 may be bonded to the surface of the support unit 134, the surface facing the casing 10, without using the first mounting recess 1342.

The first sealing unit 1343 may be formed to form a closed loop, for example, a closed loop surrounding at least the expression surface. Accordingly, at least the expression surface may be encapsulated against the external moisture, damp, and/or contaminants.

In the embodiment illustrated with reference to FIG. 6, the skin module 13 includes the film 131 and the spacer 132, but one or more embodiments are not limited thereto, that is, the disclosure may be also applied to an embodiment in which the spacer 132 is integrally provided with the film 131 and an embodiment in which the skin module 13 includes the groove 103 formed in the casing 10 and the film 131.

Figure 7:
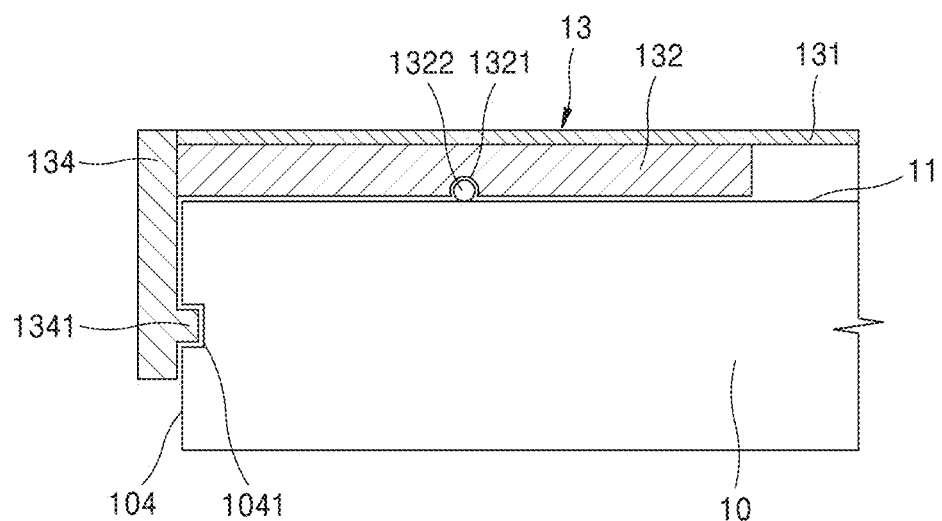
FIG. 7 is a partially cross-sectional view showing a portion of an information output apparatus according to another embodiment.

FIG. 7 is a partially cross-sectional view showing a portion of an information output apparatus according to another embodiment.

According to the embodiment illustrated with reference to FIG. 7, a second sealing unit 1322 may be located between the film 131 and the casing 10, not on the support unit 134.

According to an embodiment, the second sealing unit 1322 may be between the spacer 132 and the expression surface 11 of the casing 10. For mounting the second sealing unit 1322, the spacer 132 may include a second mounting recess 1321 in a region facing the expression surface 11, and when the second sealing unit 1322 is mounted in the second mounting recess 1321, the second sealing unit 1322 may be fixedly located between the casing 10 and the spacer 132.

Infiltration of the moisture and damp into the active region AR from the outside may be blocked by the second sealing unit 1322, and moreover, introduction of other contaminants such as dust into the active region AR may be prevented.

The second sealing unit 1322 may include a material that may be elastically compressible, and as shown in FIG. 7, the second sealing unit 1322 may be partially and forcibly fitted into the second mounting recess 1321 of the spacer 132. However, one or more embodiments are not limited thereto, that is, the second sealing unit 1322 may be bonded to the second mounting recess 1321. Selectively, the second sealing unit 1322 may be bonded to the surface of the spacer 132, the surface facing the casing 10, without using the second mounting recess 1321.

The second sealing unit 1322 may be formed to form a closed loop, for example, a closed loop surrounding at least the expression surface. Accordingly, at least the expression surface may be encapsulated against the external moisture, damp, and/or contaminants.

In the embodiment illustrated with reference to FIG. 7, the skin module 13 includes the film 131 and the spacer 132, but one or more embodiments are not limited thereto, that is, the disclosure may be also applied to an embodiment in which the spacer 132 is integrally provided with the film 131 and an embodiment in which the skin module 13 includes the groove 103 formed in the casing 10 and the film 131.

Although not shown in the drawings, the information output apparatus according to another embodiment may include both the first sealing unit 1343 of FIG. 6 and the second sealing unit 1322 of FIG. 7. Accordingly, the sealing property with respect to at least the expression surface may be further improved, and the waterproof characteristic of the information output apparatus may be implemented.

Figure 8:
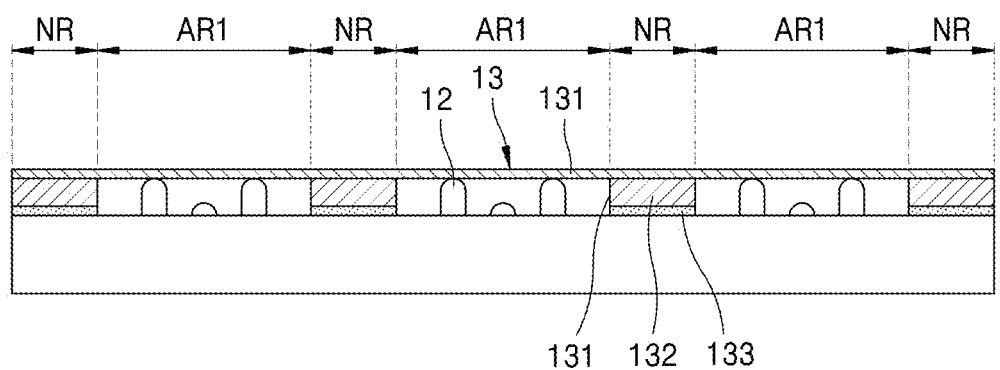
FIG. 8 is a cross-sectional view of an information output apparatus according to another embodiment.

FIG. 1 and FIG. 3 show one active region AR and one non-active region NR surrounding the active region AR, but one or more embodiments are not limited thereto, that is, a plurality of active regions AR and a plurality of non-active regions NR may be formed as shown in FIG. 8.

The embodiment illustrated with reference to FIG. 8 may be combined with all the embodiments described above.

In the information output apparatus according to the embodiments, the expression hole is formed in the expression surface, and the protrusion repeatedly protrudes through the expression hole, and thus, the protrusion and the expression hole may be separated a certain distance from each other. In addition, the driving module connected to the protrusion is located right inside the expression hole, and when moisture, damp, and/or contaminants are infiltrated into the information output apparatus through the expression hole or attached around the expression hole, a durability of the information output apparatus may degrade.

The information output apparatus according to the embodiments include the skin module so as to protect the expression surface against the external moisture, damp, and/or contaminants, and accordingly, the durability of the information output apparatus may be improved.

Moreover, a waterproof function required for daily life and an underwater waterproof function are provided, and thus the information output apparatus may be used as a wearable device or may be used underwater.

While the disclosure has been particularly shown and described with reference to exemplary embodiments thereof, it will be understood by those of ordinary skill in the art that various changes in form and details may be made therein without departing from the spirit and scope as defined by the following claims. Therefore, the scope sought to be protected of the disclosure shall be defined by the appended claims.

The particular implementations shown and described herein are illustrative examples of the embodiments and are not intended to otherwise limit the scope of the embodiments in any way. For the sake of brevity, electronics, control systems, software, and other functional aspects of the systems according to the related art may not be described in detail. Furthermore, the connecting lines or connectors shown in the drawings are intended to represent example functional relationships and/or physical or logical couplings between the various elements. It should be noted that many alternative or additional functional relationships, physical connections, or logical connections may be present in a practical device. Moreover, no item or component is essential to the practice of the disclosure unless the element is specifically described as "essential" or "critical".

The singular forms "a," "an" and "the" in the specification of the embodiments, in particular, claims, may be intended to include the plural forms as well. Unless otherwise defined, the ranges defined herein is intended to include values within the range as individually applied and may be considered to be the same as individual values constituting the range in the detailed description. Finally, operations constituting methods may be performed in appropriate order unless explicitly described in terms of order or described to the contrary. Exemplary embodiments are not necessarily limited to the order of operations given in the description. The examples or exemplary terms (for example, etc.) used herein are to merely describe exemplary embodiments in detail are not intended to limit the embodiments unless defined by the following claims. Also, those of ordinary skill in the art will readily appreciate that many alternations, combinations and modifications, may be made according to design conditions and factors within the scope of the appended claims and their equivalents.

What is claimed is:

1. An information output apparatus comprising:
    a casing comprising an expression surface and an expression hole formed in the expression surface;
    a protrusion configured to cause information to be expressed on the expression surface based on at least a part of the protrusion protruding from the expression hole of the expression surface;
    a driving module located inside the casing and connected to the protrusion to move the protrusion; and
    a skin module located facing the expression surface, the skin module comprising a film having a first surface and a second surface opposite to the first surface, the first surface facing the expression surface,
    wherein the casing comprises an active region in which the protruding of the protrusions are activated and a non-active region outside the active region,
    wherein the film is separated from the expression surface in the active region, and
    wherein the skin module comprises a spacer located between the film and the casing in the non-active region.

2. The information output apparatus of claim 1, further comprising an adhesive film between the spacer and the casing.

3. The information output apparatus of claim 1, wherein the film and the spacer are integrally provided.

4. The information output apparatus of claim 1, wherein the casing further comprises:
    a groove corresponding to the active region, wherein the protrusion is disposed in the groove.

5. The information output apparatus of claim 4, further comprising an adhesive film between the film and the casing outside the groove.

6. The information output apparatus of claim 1, wherein a first coupling unit is located on at least a part of the casing, and
    the skin module comprises:
    a support unit coupled at least to an edge of the film and configured to be coupled to the casing.

7. The information output apparatus of claim 6, further comprising a sealing unit located at least one of between the support unit and the casing and between the film and the casing.

8. The information output apparatus of claim 1, wherein the film has no through-hole formed therein.

9. The information output apparatus of claim 1, wherein the expression surface at least partially vertically overlaps the driving module.

10. The information output apparatus of claim 1, wherein the skin module is configured to allow a user to sense a movement of the protrusion through tactile sensing transferred from the first surface of the film to the second surface of the film.

11. The information output apparatus of claim 1, wherein the film is disposed above the expression surface.

* * * * *